United States Patent
Gamage et al.

(10) Patent No.: US 8,511,171 B2
(45) Date of Patent: Aug. 20, 2013

(54) DEVICE FOR MEASURING ENVIRONMENTAL FORCES AND METHOD OF FABRICATING THE SAME

(75) Inventors: Sisira Kankanam Gamage, Palo Alto, CA (US); Naresh Venkata Mantravadi, San Jose, CA (US)

(73) Assignee: General Electric Company, Schenectady, NY (US)

( * ) Notice: Subject to any disclaimer, the term of this patent is extended or adjusted under 35 U.S.C. 154(b) by 147 days.

(21) Appl. No.: 13/113,131

(22) Filed: May 23, 2011

(65) Prior Publication Data
US 2012/0297884 A1    Nov. 29, 2012

(51) Int. Cl.
*G01L 9/00* (2006.01)
(52) U.S. Cl.
USPC .............................................. 73/754; 438/53
(58) Field of Classification Search
USPC .................................................. 73/700–756
See application file for complete search history.

(56) References Cited

U.S. PATENT DOCUMENTS

| | | | | |
|---|---|---|---|---|
| 5,069,419 | A * | 12/1991 | Jerman | 251/11 |
| 5,165,289 | A * | 11/1992 | Tilmans | 73/862.59 |
| 5,511,428 | A * | 4/1996 | Goldberg et al. | 73/777 |
| 7,284,441 | B2 | 10/2007 | Zdeblick | |
| 7,327,003 | B2 | 2/2008 | Martin et al. | |
| 7,478,559 | B2 | 1/2009 | Tan et al. | |
| 7,998,777 | B1 * | 8/2011 | Gamage et al. | 438/53 |
| 2007/0238215 | A1 * | 10/2007 | Stewart et al. | 438/53 |
| 2008/0175529 | A1 * | 7/2008 | Kurtz et al. | 385/13 |

* cited by examiner

*Primary Examiner* — Andre Allen
(74) *Attorney, Agent, or Firm* — Hiscock & Barclay LLP

(57) ABSTRACT

A device for measuring environmental forces, and a method for fabricating the same, is disclosed that comprises a device wafer, the device wafer comprising a first device layer separated from a second device layer by a first insulation layer. The first device wafer is bonded to an etched substrate wafer to create a suspended diaphragm and boss, the flexure of which is determined by an embedded sensing element.

20 Claims, 4 Drawing Sheets

DEVICE FOR MEASURING ENVIRONMENTAL FORCES AND METHOD OF FABRICATING THE SAME

BACKGROUND OF THE INVENTION

The subject matter disclosed herein relates to semiconductor microelectromechanical based sensors (MEMS) that can be used to detect small forces or flexures generated from environmental factors, for example mechanical stress, chemo-mechanical stress, thermal stress, electromagnetic fields, and the like. More particularly, the subject matter disclosed herein relates to a device for sensing pressure and a method of fabricating the same.

Advances in semiconductor microelectronic based sensors have served greatly to reduce the size and cost of such sensors. The electrical and mechanical properties of silicon microsensors, as well as silicon micromachining and semiconductor microelectronic technologies, have improved. For instance, micromachined silicon pressure sensors, acceleration sensors, flow sensors, humidity sensors, microphones, mechanical oscillators, optical and RF switches and attenuators, microvalves, ink jet print heads, atomic force microscopy tips and the like are widely known to have found their way into various applications in medical, aerospace, industrial and automotive markets. The high yield strength, elasticity at room temperature, and hardness properties of silicon makes it an ideal base material for resonant structures that may, for example, be useful for sensor structures. Even consumer items such as watches, scuba diving equipment and hand-held tire pressure gauges may incorporate silicon micromachined sensors.

The demand for silicon sensors in ever expanding fields of use continues to fuel a need for new and different silicon microsensor geometries and configurations optimized for particular environments and applications. These expanding fields of use for microelectromechanical devices in general, and sensors used to measure environmental forces such as pressure in particular, have created a demand for ever smaller devices. Unfortunately, there has been difficulty producing smaller devices that are also highly sensitive to small changes in pressure. Because of the small size of the devices and the thin nature of the geometries used, it is difficult for conventional techniques to maintain the stringent tolerances required, especially during high volume fabrication. Additionally, limitations in the depth to which structures may be diffused or implanted within such MEMS devices during fabrication limit the design and operational characteristics of such devices.

It would be advantageous to provide a method for manufacturing highly sensitive pressure sensors that are not only small in size, but which can be effectively produced in high volume.

The discussion above is merely provided for general background information and is not intended to be used as an aid in determining the scope of the claimed subject matter.

BRIEF DESCRIPTION OF THE INVENTION

A device for measuring environmental forces, and a method for fabricating the same, is disclosed that comprises a device wafer, the device wafer comprising a first device layer separated from a second device layer by a first insulation layer. The first device wafer is bonded to an etched substrate wafer to create a suspended diaphragm and boss, the flexure of which is determined by an embedded sensing element. An advantage that may be realized in the practice of some embodiments of the described device and method of fabrication is that the thickness of both the diaphragm and the boss structure of a MEMS based pressure sensor can be precisely controlled using high volume planar fabrication techniques. In turn, these precise thicknesses determine the operational characteristics of the sensor, resulting in improved performance and lower positional sensitivity, especially in low pressure environments, for example, less than one atmosphere.

In one exemplary embodiment, a device is disclosed, the device comprising a boss comprising a portion of a first device layer of a device wafer, the device wafer comprising the first device layer and a second device layer, the first device layer separated from the second device layer by a first insulation layer, a diaphragm cavity located on a top surface of a substrate wafer, the top surface of the substrate wafer bonded to a top surface of the first device layer to form a diaphragm over the diaphragm cavity, the diaphragm comprising a portion of the second device layer, and the boss extending from the diaphragm, and a sensing element located in the second device layer to sense flexure in the diaphragm.

In another exemplary embodiment, a method for fabricating a device is disclosed comprising the steps of forming a boss cavity on a top surface of a first device layer of a device wafer to form a boss, the device wafer comprising the first device layer, a second device layer separated from the first device layer by a first insulation layer, and a handle layer separated from the second device layer by a second insulation layer, forming a diaphragm cavity on a top surface of a substrate wafer, bonding the top surface of the first device layer to the top surface of the substrate wafer to form a diaphragm over the diaphragm cavity, the diaphragm comprising a portion of the second device layer, and the boss extending from the diaphragm, removing the handle layer and the second insulation layer from the device wafer, and placing a sensing element in the second device layer to sense flexure in the diaphragm.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

A device for measuring environmental forces, and a method for fabricating the same, is disclosed that comprises a device wafer, the device wafer comprising a first device layer separated from a second device layer by a first insulation layer. The first device wafer is bonded to an etched substrate wafer to create a suspended diaphragm and boss, the flexure of which is determined by an embedded sensing element. An advantage that may be realized in the practice of some embodiments of the described device and method of fabrication is that the thickness of both the diaphragm and the boss structure of a MEMS based pressure sensor can be precisely controlled using high volume planar fabrication techniques. In turn, these precise thicknesses determine the operational characteristics of the sensor, resulting in improved performance and lower positional sensitivity, especially in low pressure environments, for example, less than one atmosphere.

An exemplary pressure sensor can be made by forming a cavity within a silicon structure and a diaphragm adjacent to the cavity. In absolute pressure sensor embodiments, in which measurements are made in relation to a selected reference pressure, the cavity can be held in a vacuum or a selected internal pressure. The pressure sensor measures pressure by sensing the flexure of the diaphragm, for example how the pressure acting on the diaphragm deflects the diaphragm towards or away from the diaphragm cavity. One or more sensing elements formed near the edges of the diaphragm typically sense the flexure or deflection of the diaphragm. In differential pressure sensor embodiments, in which pressure measurements are made with respect to the pressure acting on the diaphragm in relation to the environmental pressure in which the sensor is located, the cavity can be opened to the surrounding environment.

Figure 1:
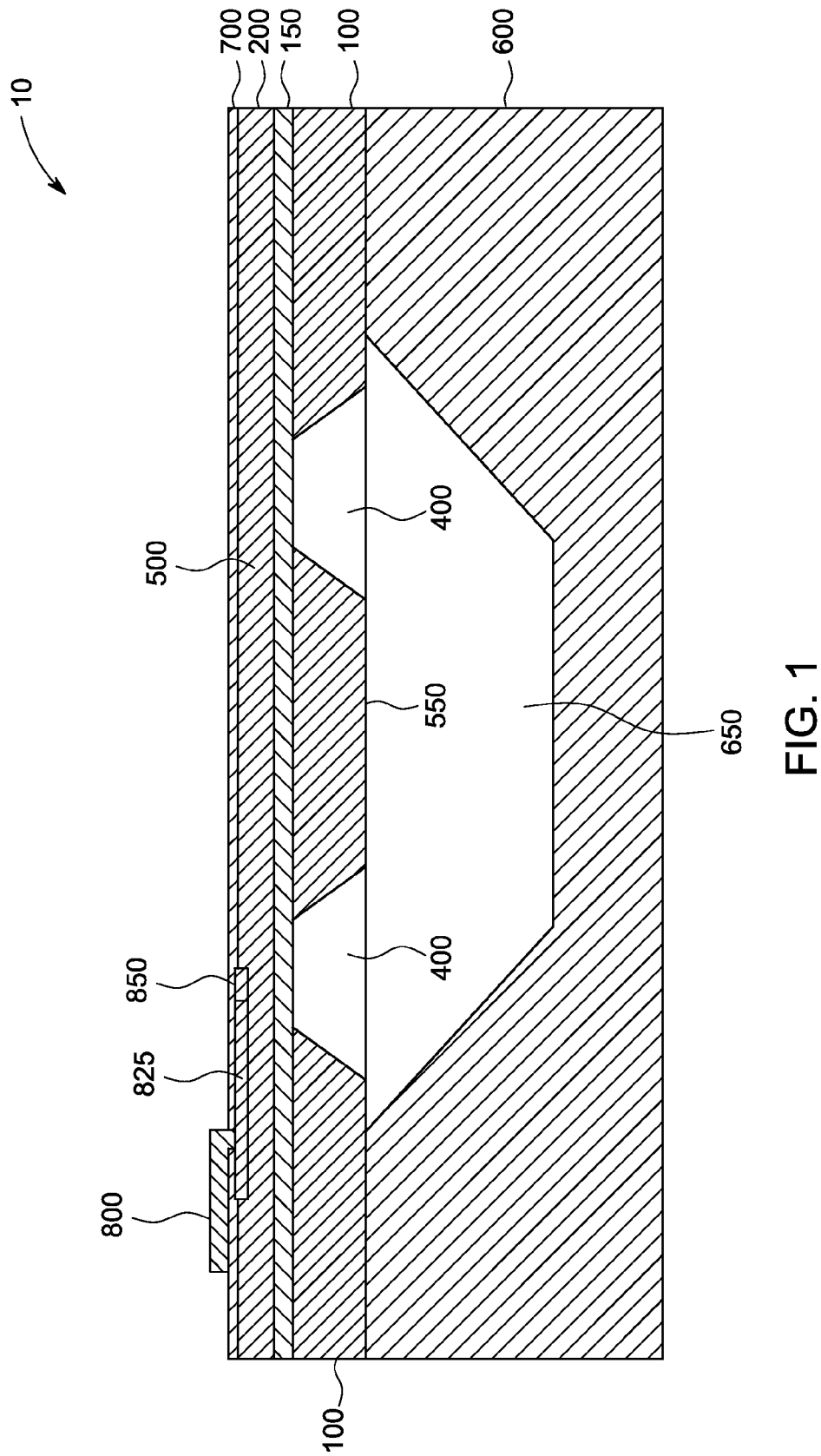
FIG. 1 is a cross sectional view of a sensor in an exemplary embodiment of the invention.

FIG. 1 shows a cross sectional view of a sensor 10 in an exemplary embodiment of the invention. Sensor 10 can comprise a substrate wafer 600 into which a diaphragm cavity 650 can be etched. In one embodiment, substrate wafer 600 can be a double side polished silicon wafer which can have n-type or p-type doping and be of a suitable thickness to meet the design and manufacturing requirements of the sensor 10. In other embodiments, substrate wafer 600 can be a device layer of a silicon-on-insulator wafer having an insulation layer located between a device layer and a handle layer. Suspended over the diaphragm cavity 650 can be a diaphragm 500, which can comprise a portion of a second device layer 200 and a portion of a first insulation layer 150 of a device wafer having two device layers separated by insulation layers, for example a double silicon-on-insulator wafer (DSOI). Suspended from diaphragm 500 can be a boss 550, which can be a portion of a first device layer 100 of a device wafer that is separated from the rest of the first device layer 100 by one or more boss cavities 400.

Figure 3:
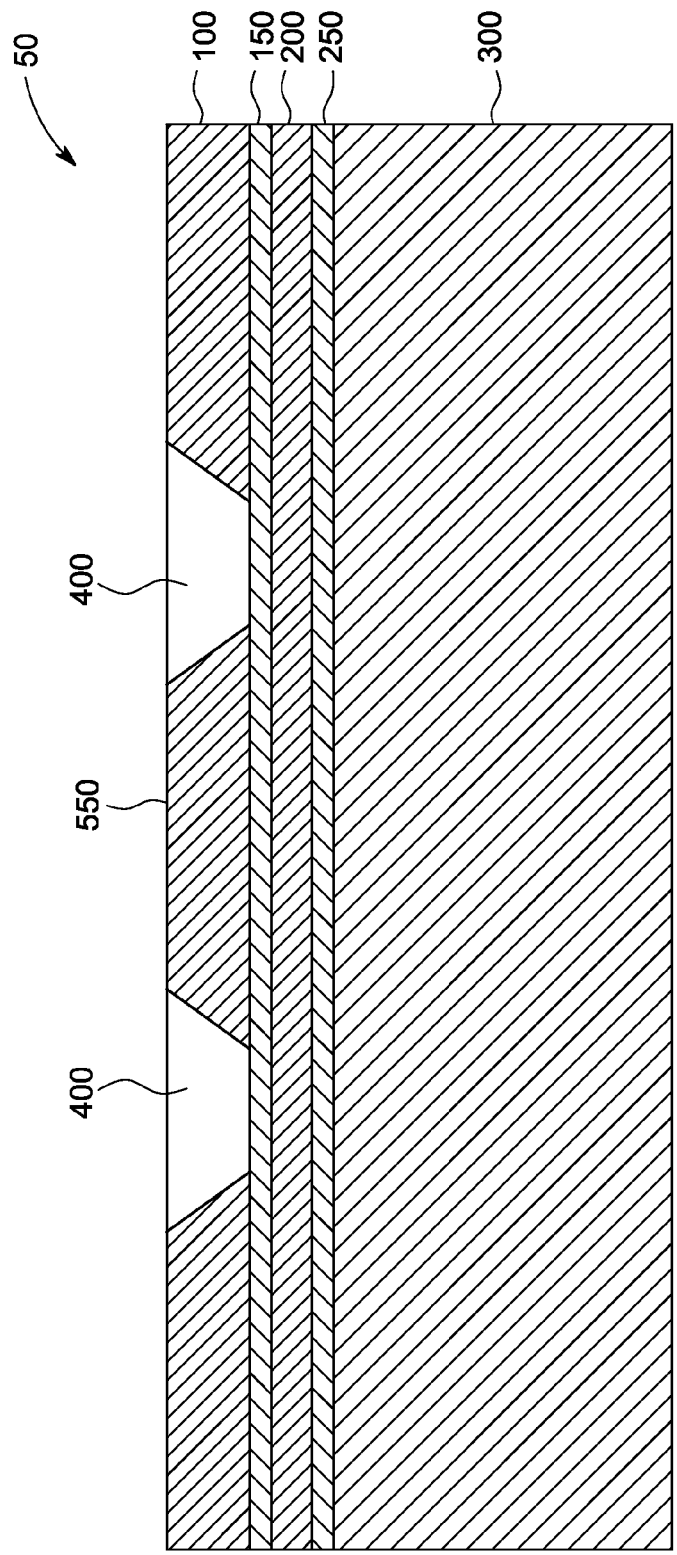
FIG. 3 is a cross sectional view of a device wafer having etched boss cavities in an exemplary embodiment of the invention.

FIG. 3 is a cross sectional view of a device wafer 50 having etched boss cavities 400 in an exemplary embodiment of the invention. As shown in FIG. 3, a device wafer 50 can comprise a first device layer 100, first insulation layer 150, second device layer 200, second insulation layer 250, and handle layer 300. First device layer 100 can be a single crystal silicon substrate which, in one embodiment, can have n-type or p-type doping and be of a suitable thickness to meet the operational and physical design characteristics of the sensor 10. Second device layer 200 can be a single crystal silicon substrate which, in one embodiment, can be a thickness selected to meet particular design specifications, and which can have n-type or p-type doping. The thickness of the various layers of the device wafer 50 can be precisely set using conventional wafer manufacturing techniques, and can be selected such that the precise thickness of the layers determine the subsequent operational and physical characteristics of the sensor 10, as will be described below.

First and second insulation layers 150 and 250, respectively, can, in one exemplary embodiment, be silicon dioxide and be of a suitable thickness to meet the manufacturing and design requirements of the sensor 10. Handle layer 300 can be used to grip the device wafer 50 during the manufacturing process. First insulator layer 150 can be located between first device layer 100 and second device layer 200, while second insulation layer 250 can be located between second device layer 200 and handle layer 300. Handle layer 300 can consist of, for example, n-type or p-type silicon and be of a suitable thickness to meet the design and manufacturing requirements of the sensor 10. Together, the thicknesses of the various layers comprising the sensor 10 can be selected such that the overall thickness of the device meets the operational and physical design characteristics of the sensor 10. In particular, the thickness of substrate wafer 600 can be selected to minimize packaging stress transferred to diaphragm 500.

With reference again to FIG. 1, one or more sensing elements 850, for example a piezoresistive sensing element, can be strategically implanted or diffused within the second device layer 200 to sense flexure in the silicon structures caused by environmental forces, for example pressure, acting on sensor 10, in particular flexure of the diaphragm 500 suspended over the open diaphragm cavity 650 within the sensor 10. Sensor 10 can also include passivation layer 700 that can consist of, for example, a silicon dioxide layer, a silicon nitride layer, or a combination of both. Passivation layer 700 can provide electrical insulation and protection to sensor 10 during manufacturing and operation. The non-bonded, exterior facing side of substrate wafer 600 can also have a passivation layer deposited on it (not shown). One or more interconnects 825 formed in second device layer 200 can electrically couple one or more sensing elements 850 to an external surface of the sensor 10, while one or more metallization layers 800 can provide electrical connectivity between the interconnects 825 and an external contact on the sensor 10 such that the sensor 10 can be electrically coupled to other devices or connections through, for example, a lead attachment.

With reference to FIG. 1, an exemplary sensor 10 and operation thereof is described in one embodiment of the invention. Sensor 10 can operate by measuring flexure in a thinned structure, namely diaphragm 500, formed in second device layer 200 over a diaphragm cavity 650 formed in the top surface of a substrate wafer 600, which can be bonded to the first device layer 100 of a device wafer. The diaphragm 500 can serve as a flexure structure in sensor 10. As the pressure differs between that in diaphragm cavity 650 and that above diaphragm 500, diaphragm 500 will flex towards or away from the diaphragm cavity 650. The flexure in diaphragm 500 can be detected by one or more sensing elements 850 that can be placed in second device layer 200 on or near the edges of diaphragm 500. In one embodiment using piezoresistive sensing elements, the resistance of sensing element 850 can be determined using a circuit, such as a wheatstone bridge circuit or the like, interconnected using one or more interconnects 825 attached to one or more metallization layers 800. An electrical interface or other such device can be attached to the ends of the metallization layers 800 to place the sensor 10 in electrical communication with another device. The resistance of the piezoresistive sensing element 850 varies with the flexure of diaphragm 500. Thus, measurement of the piezoresistive resistance of sensing element 850 can be used to determine the amount of flexure in diaphragm 500, and thereby determine the pressure exerted on sensor 10.

Figure 2:
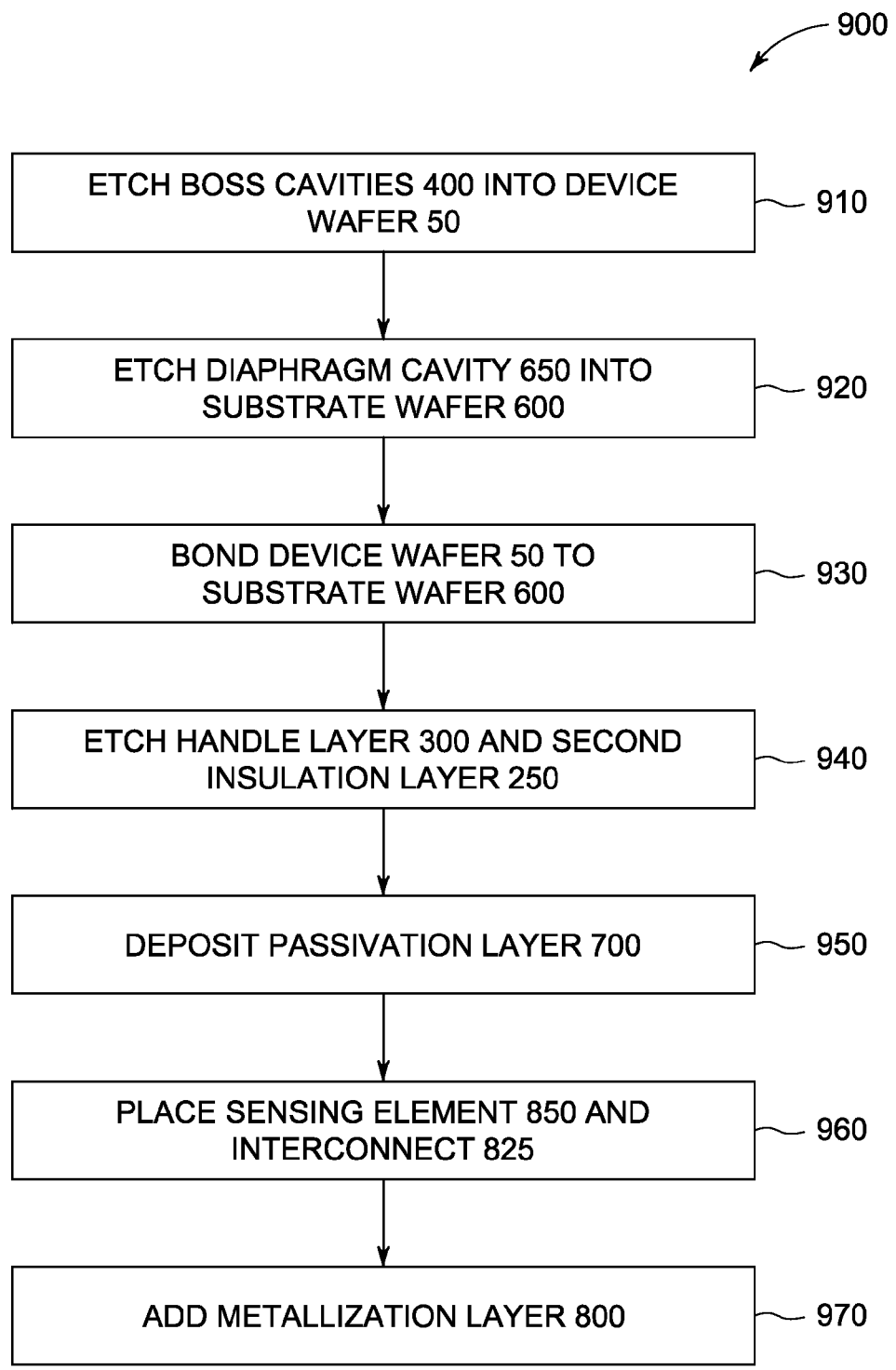
FIG. 2 is a process flow showing the steps in fabricating a sensor in an exemplary embodiment of the invention.

An exemplary process for fabricating a silicon sensor such as the one illustrated in FIG. 1 is explained with reference to FIGS. 1 through 4. FIG. 2 is an exemplary process flow 900 for fabricating a sensor 10 in one embodiment of the invention. With reference to FIGS. 2 and 3, in process step 910 of FIG. 2, one or more boss cavities 400 can be etched into first device layer 100 of a device wafer 50 to form boss 550. Boss 550 can function as a mass attached to and extending from diaphragm 500 that concentrates physical stresses on the diaphragm 500 to improve pressure response and sensitivity of the sensor. The shape of boss 550, as determined by the one or more boss cavities 400, can be selected to meet design specifications. In particular, boss 550 can act to improve the linearity of the pressure response of sensor 10, especially in embodiments utilizing a thin diaphragm 500 to measure low pressure. Further the size, thickness and mass of boss 550 can be precisely controlled based on the thickness of first device layer 100, thereby minimizing position sensitivity of sensor 10. Boss cavities 400 can be etched into the first device layer 100 down to the first insulation layer 150 using dry or wet etching techniques, for example DRIE, wet etching with KOH or TMAH, or other silicon etchants or the like. First insulation layer 150 can be left in place or etched off as well using wet or dry removal techniques. The surface of boss cavities 400 can be, for example, bare silicon, oxidized silicon, doped silicon, or it can be coated with any other thin film capable of withstanding subsequent wafer bonding and processing temperatures.

Figure 4:
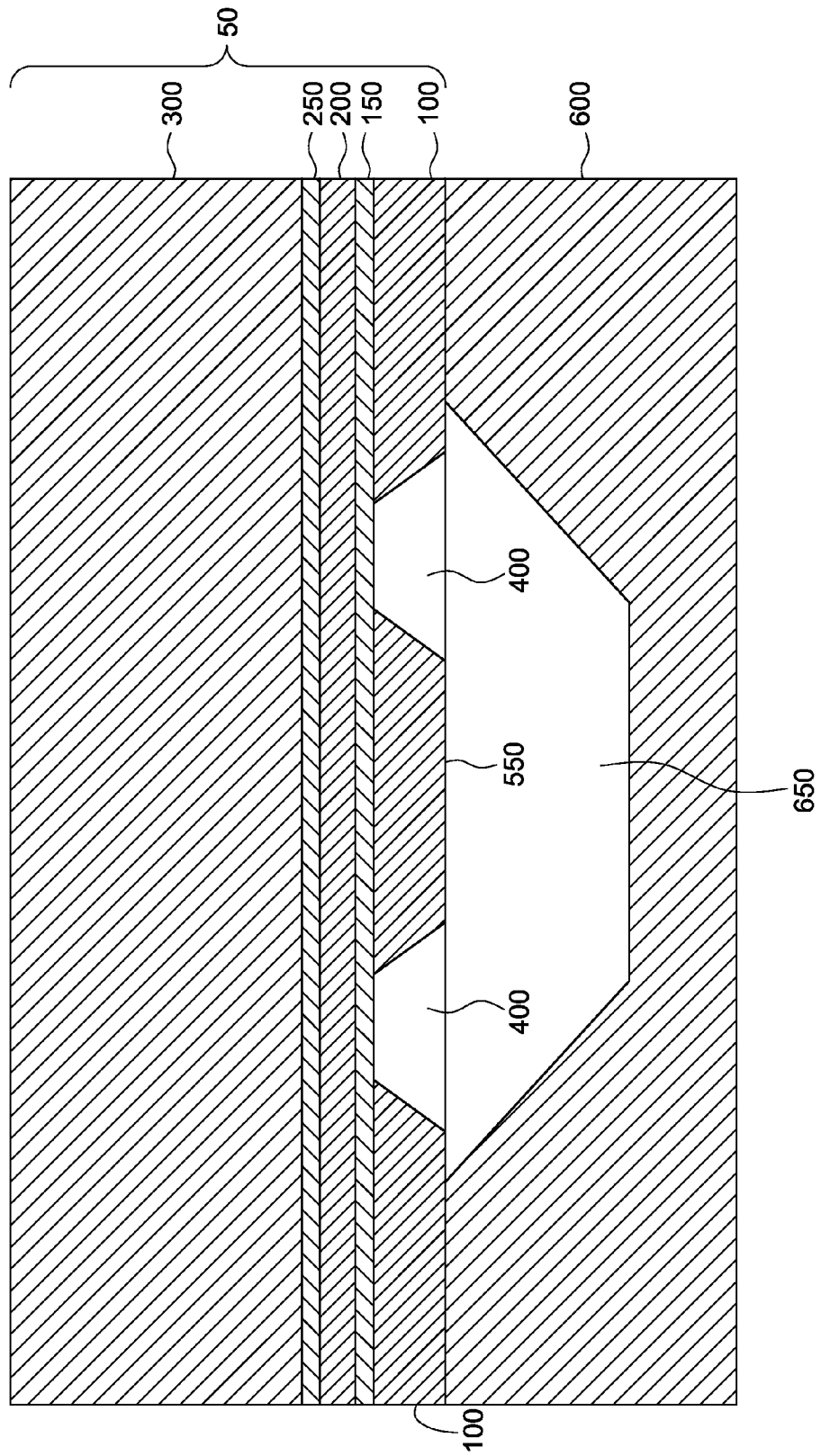
FIG. 4 is a cross sectional view of a device wafer having boss cavities bonded to a substrate wafer having a diaphragm cavity in an exemplary embodiment of the invention.

FIG. 4 is a cross sectional view of device wafer 50 having boss cavities 400 bonded to a substrate wafer 600 having a diaphragm cavity 650 in an exemplary embodiment of the invention. With reference to FIG. 4, in process step 920 of FIG. 2, diaphragm cavity 650 can be etched into substrate wafer 600 using dry or wet etching techniques, for example DRIE, wet etching with KOH or TMAH, or other silicon etchants or the like. Diaphragm cavity 650 can have various geometries, for example square, rectangular or circular, and can have any required depth to meet the physical and operational design requirements of sensor 10, which can, in turn, depend on the design and operational characteristics of the sensor and/or the chosen thickness of the substrate wafer 600. The surface of diaphragm cavity 650 can be, for example, bare silicon, oxidized silicon, doped silicon, or it can be coated with any other thin film capable of withstanding subsequent wafer bonding and processing temperatures. In embodiments in which substrate wafer 600 comprises the device layer of a silicon-on-insulator wafer, the etch forming the diaphragm cavity 650 can be chosen such that it stops at the insulation layer. Additionally, the thickness of the device layer of the silicon-on-insulator wafer can be precisely controlled during fabrication, thereby allowing the resulting thickness of substrate wafer 600 to be precisely controlled.

With continued reference to FIG. 4, in process step 930 of FIG. 2, the top surface of the device wafer 50, namely the top surface of the first device layer 100 having etched boss cavities 400, is bonded to the top surface of substrate wafer 600, namely the surface into which diaphragm cavity 650 has been etched, using conventional silicon fusion bonding techniques. In one exemplary fusion bonding technique, the opposing surfaces can be made hydrophilic, that is, the surfaces can be treated with a strong oxidizing agent that causes water to adhere to them. The two wafers can then be placed in a high temperature environment to form a bond, the quality of which can be determined by the period of time the wafers are exposed to the high temperature environment. The silicon fusion bonding technique described above bonds the first device layer 100 and the substrate wafer 600 together without the use of an intermediate adhesive material that could have a different coefficient of thermal expansion than the single crystal silicon wafer. The device wafer 50 and substrate wafer 600 can be bonded such that diaphragm 500 is formed over diaphragm cavity 650, with boss 550 extending from diaphragm 500.

In process step 940 of FIG. 2, the handle layer 300 of device wafer 50 can be removed using a wet etchant, such as KOH or TMAH, which stops on the second insulation layer 250. Additionally, second insulation layer 250 can be removed using wet or dry etching techniques, leaving the second device layer 200 exposed. In other embodiments, both the handle layer 300 and the second insulation layer 250 can be removed and/or thinned using physical thinning techniques such as grinding.

In process step 950 of FIG. 2, and with reference again to FIG. 1, passivation layer 700 can be deposited on the exposed top surface of second device layer 200 using, for example, silicon dioxide, silicon nitride layers, or combinations of both. As part of process step 950, the non-bonded, exterior facing side of substrate wafer 600 can also have a passivation layer deposited on it (not shown). In process step 960 of FIG. 2, one or more sensing elements 850 can be placed in the second device layer 200 by diffusion or ion implantation of, in one embodiment using piezoresistive sensing elements, low doped p-type material into a doped n-type second device layer 200 in a predefined position relative to the diaphragm 500, which can be formed as part of the second device layer 200. For example, Boron implantation and diffusion at high temperature may form piezoresistive sensing elements 850 within second device layer 200. The sensing elements 850 can be positioned to sense flexure in diaphragm 500. It should be noted that any number of sensing elements 850 may be employed and their exact positioning relative to the diaphragm 500 may be different depending on the particular application, expected pressures, sensitivity requirements, and the like. Additionally, one or more interconnects 825 can be added by diffusion or ion implanting of, for example, highly doped p-type material into a doped n-type second device layer 200. Interconnect 825 can provide electrical conductivity to the sensing element 850, and can be placed in an overlapping configuration with sensing element 850. The components diffused or implanted in process step 960 can be performed using a single process or separately implanted or diffused using multiple processes Next, in process step 970, metallization layer 800 can be added, providing electrical conductivity from the outer surface of sensor 10 to sensing element 850 through interconnect 825. To provide access to interconnect 825, openings can be made in passivation layer 700 using dry or wet etching techniques. Metallization layer 800 can then be added and formed of, for example, gold or aluminum, and can be created to a desired thickness to suit device design and fabrication requirements.

As shown in FIG. 1, sensor 10 could be configured to provide absolute pressure measurements in relation to the reference pressure established within diaphragm cavity 650. If, however, a differential pressure sensor is desired, diaphragm cavity 650 can be made to extend entirely through substrate wafer 600 by removing or thinning a portion of the bottom surface of substrate wafer 600 using DRIE, wet etching with KOH or TMAH, or other silicon etchants or the like. In some embodiments, the bottom portion of substrate wafer 600 could be removed and/or thinned using physical thinning techniques such as grinding. In embodiments in which substrate wafer 600 comprises a silicon-on-insulator wafer, the handle layer and insulation layer of the silicon-on-insulator wafer can be removed, with additional thinning of the device layer performed as required. In still further embodiments, a passivation layer could be added to the bottom of the substrate wafer 600 following the thinning process.

With reference to the embodiments described herein, each etch made during the fabrication of sensor 10 can have any chosen geometry and can have any required depth depending on the particular application. The selected depth and geometry of each etch can be selected to alter the design characteristics of the resulting sensor 10. Additionally, the thickness of second device layer 200 and the size and shape of the diaphragm 500 dictated by diaphragm cavity 650 can be selected to determine the sensitivity of the resulting sensor 10. The selected thickness of second device layer 200, which can be arbitrarily chosen and precisely controlled in manufacturing the device wafers, leads to improved control over the flexibility of diaphragm 500, and therefore improved control over the performance characteristics of the resulting sensor 10. Similarly, the thickness of first device layer 100 can determine the thickness, mass and operating characteristics of the boss 550 more precisely than when using traditional etching and/or implanting techniques. Additionally, the planar manufacturing processes are ideal for manufacturing purposes and can increase not only the fabrication yield, but the overall reliability and long term performance of the resulting devices. Accordingly, uniform control over the performance characteristics of the sensor 10 can be achieved.

The above detailed description is provided to illustrate exemplary embodiments and is not intended to be limiting. Although the method for fabricating a sensor has been shown and described with respect to embodiments which measure pressure, it will be apparent to those skilled in the art that similar techniques can be used to fabricate sensors capable of measuring other parameters. For example, it should be recognized that the apparatus and method of manufacture described herein are useful in a wide variety of other applications not explicitly described herein. It will also be apparent to those skilled in the art that numerous modifications and variations within the scope of the present invention are possible. Further, numerous other materials and processes can be used within the scope of the exemplary methods and structures described as will be recognized by those skilled in the art. For example, it should be recognized that the p-type and n-type materials described herein can be used in an alternative fashion, e.g., by replacing p-type materials for n-type materials and vice versa. Additionally, it will be apparent to those of skill in the art that the sequence of steps identified and described in various exemplary embodiments need not occur in the sequence described, and that in other embodiments various steps can be combined, performed in different orders, either contiguously, non-contiguously, or in parallel, and still achieve the same result.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A device comprising:
a device wafer comprising a first device layer and a second device layer, said first device layer separated from said second device layer by a first insulation layer;
a boss comprising a portion of the first device layer, the boss adjacent to the first insulation layer;
a substrate wafer comprising a diaphragm cavity located on a first surface of the substrate wafer, said first surface of said substrate wafer bonded to a first surface of said first device layer to form a diaphragm over said diaphragm cavity, said diaphragm comprising a portion of said second device layer, and said boss extending from said diaphragm toward the diaphragm cavity; and
a sensing element located in said second device layer to sense flexure in said diaphragm.

2. The device of claim 1, further comprising:
an interconnect located in said second device layer, said interconnect being in electrical communication with said sensing element; and
a metallization layer, said metallization layer providing electrical communication between an outer surface of said device and said interconnect.

3. The device of claim 1, wherein said sensing element comprises a piezoresistive sensing element.

4. The device of claim 1, wherein said substrate wafer comprises a double side polished wafer.

5. The device of claim 1, wherein said substrate wafer comprises a device layer of a silicon-on-insulator wafer.

6. The device of claim 1, wherein said device measures absolute pressure.

7. The device of claim 1, wherein said diaphragm cavity extends entirely through said substrate wafer.

8. The device of claim 7, wherein said device measures differential pressure.

9. The device of claim 1, wherein said device measures low pressure.

10. The device of claim 1, wherein the thickness of said substrate wafer is chosen to minimize the packaging stress transferred to said diaphragm.

11. A method for fabricating a device comprising the steps of:
providing a device wafer, said device wafer comprising a first device layer, and a second device layer separated from said first device layer by a first insulation layer;
forming a boss in the first device layer, the boss adjacent to the first insulation layer;
providing a substrate wafer;
forming a diaphragm cavity on a first surface of the substrate wafer;
bonding a first surface of said first device layer to said first surface of said substrate wafer, including forming a diaphragm over said diaphragm cavity, said diaphragm comprising a portion of said second device layer, and said boss extending from said diaphragm; and placing a sensing element in said second device layer to sense flexure in said diaphragm.

12. The method of claim 11, further comprising the steps of:
  placing an interconnect in said second device layer, said interconnect being in electrical communication with said sensing element; and
  forming a metallization layer, said metallization layer providing electrical communication between an outer surface of said sensor and said interconnect.

13. The method of claim 11, wherein said sensing element comprises a piezoresistive sensing element.

14. The method of claim 11, wherein said substrate wafer comprises a double side polished wafer.

15. The method of claim 11, wherein said substrate wafer comprises a device layer of a silicon-on-insulator wafer having a second insulation layer located between said device layer and a handle layer.

16. The method of claim 15, further comprising the step of removing said handle layer and said second insulation layer from said silicon-on-insulator wafer.

17. The method of claim 11, wherein said device measures absolute pressure.

18. The method of claim 11, further comprising the step of thinning said substrate wafer to expose said diaphragm cavity.

19. The method of claim 18, wherein said device measures differential pressure.

20. The method of claim 11, wherein the thickness of said substrate wafer is chosen to minimize the packaging stress transferred to said diaphragm.

* * * * *